(12) United States Patent
Fujinaga et al.

(10) Patent No.: US 6,396,113 B1
(45) Date of Patent: May 28, 2002

(54) ACTIVE TRENCH ISOLATION STRUCTURE TO PREVENT PUNCH-THROUGH AND JUNCTION LEAKAGE

(75) Inventors: Masato Fujinaga; Tatsuya Kunikiyo, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/556,037

(22) Filed: Apr. 20, 2000

(30) Foreign Application Priority Data

Nov. 19, 1999 (JP) ............................. 11-329444

(51) Int. Cl.$^7$ .............................. H01L 29/94
(52) U.S. Cl. ................. 257/397; 438/297; 438/439
(58) Field of Search ................ 257/374, 394–397; 438/297, 439, 225, 452, 207, 218, 219

(56) References Cited

U.S. PATENT DOCUMENTS 6,057,580 A * 5/2000 Watanabe et al. ........... 257/396

FOREIGN PATENT DOCUMENTS

| JP | 61-271854 | 12/1986 | | |
|----|-----------|---------|---|---|
| JP | 62-73737 | 4/1987 | | |
| JP | 63-122145 | 5/1988 | | |
| JP | 63122145 A | * 5/1988 | ........... | H01L/21/76 |
| JP | 1-138730 | 5/1989 | | |
| JP | 6-140500 | 5/1994 | | |
| JP | 8-172124 | 7/1996 | | |

* cited by examiner

Primary Examiner—Nathan Flynn
Assistant Examiner—Scott R. Wilson
(74) Attorney, Agent, or Firm—Oblon, Spivak, McClelland, Maier & Neustadt, P.C.

(57) ABSTRACT

A semiconductor device capable of controlling an electric potential of an electric conductor to reduce both a leakage caused by a punch-through and a junction leakage in a trench isolating structure having the electric conductor in a trench portion. In a trench isolating structure, an insulating film is disposed on an inner surface of a trench provided in a silicon substrate and doped polysilicon doped with phosphorus in a concentration of approximately $1 \times 10^{20}/cm^3$, for example, is buried as an electric conductor in a lower side of a trench space defined by the insulating film. In addition, a silicon oxide is buried as an insulator in an upper side of the trench space. For the silicon oxide to be used, a TEOS oxide film, a HDP oxide film or a SiOF film having a small dielectric constant may be buried.

15 Claims, 11 Drawing Sheets

F I G. 1
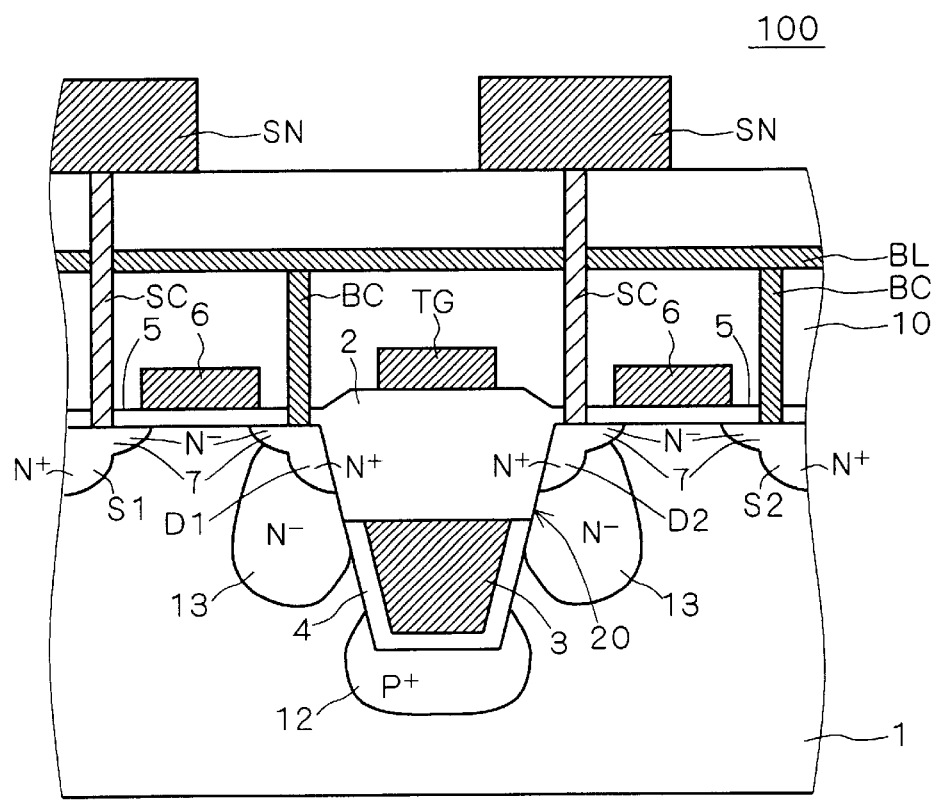

F I G. 16
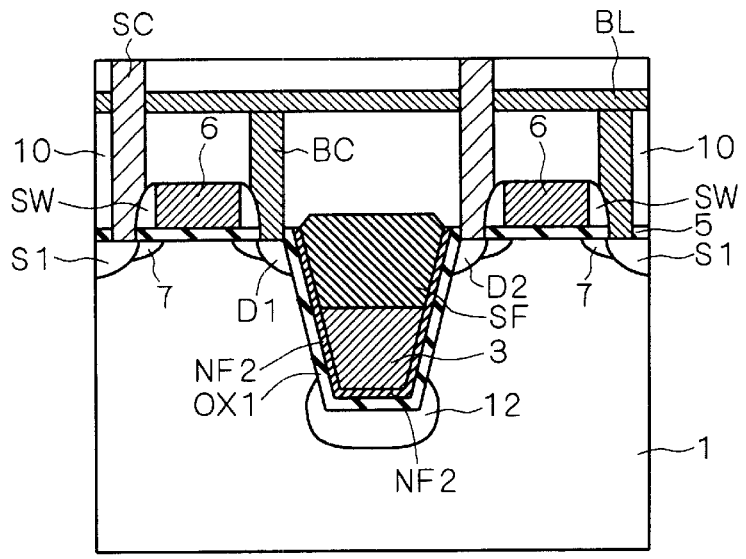
F I G. 17
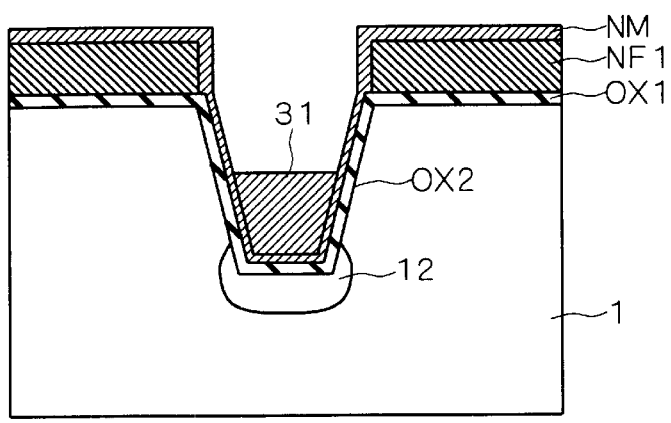
F I G. 18
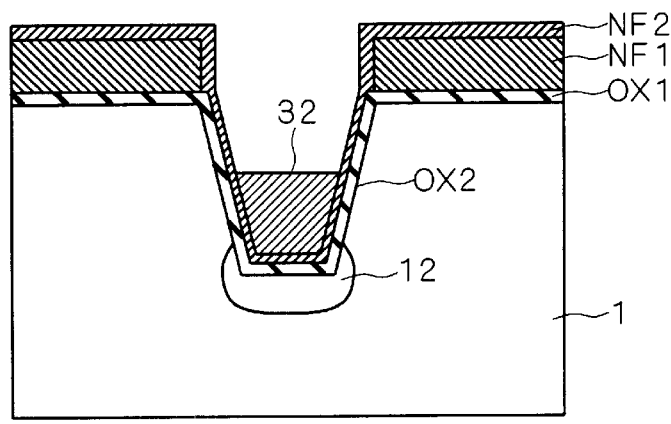

F I G. 21
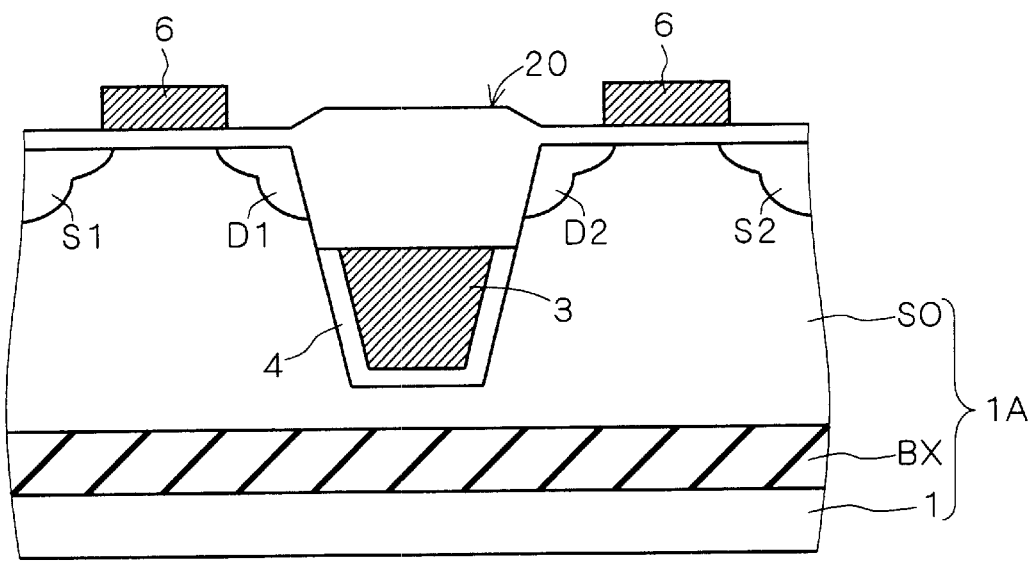
F I G. 22
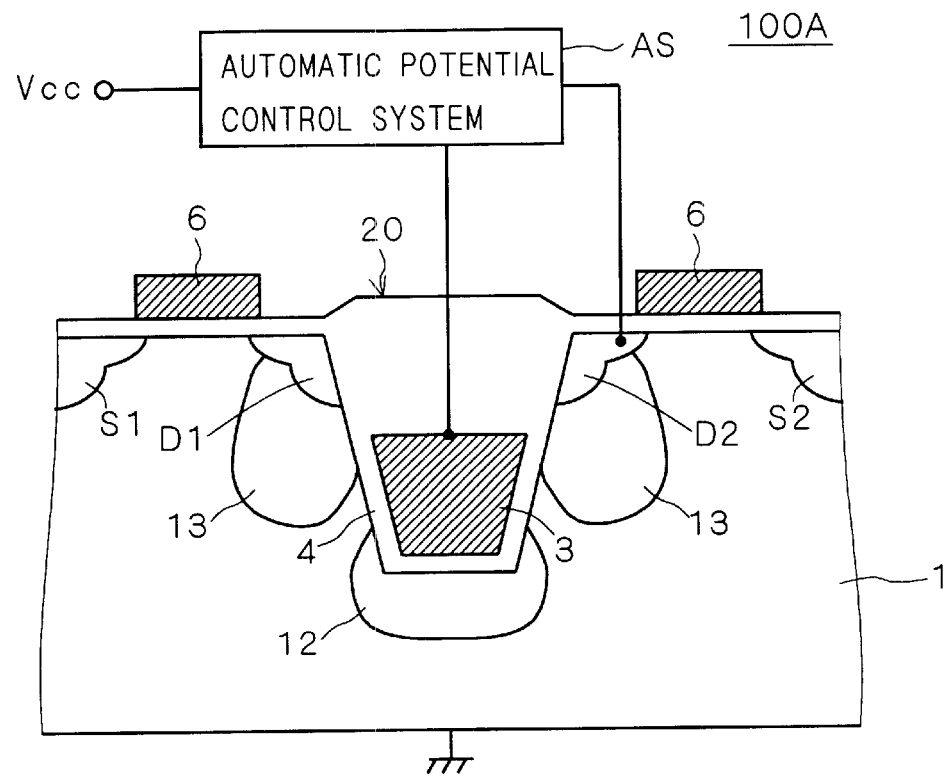

ACTIVE TRENCH ISOLATION STRUCTURE TO PREVENT PUNCH-THROUGH AND JUNCTION LEAKAGE

BACKGROUND OF THE INVENTION

1. Field of the Invention

The present invention relates to a semiconductor device, and more particularly to an element isolating structure of the semiconductor device.

2. Description of the Background Art

In a semiconductor device, individual semiconductor elements are electrically isolated by LOCOS isolation or trench isolation. In the case where an integration degree of the semiconductor device is relatively low, the LOCOS isolation is enough. However, the trench isolation has been increasingly required with an enhancement in the integration degree.

An example of a structure of the trench isolation will be described with reference to FIG. 25. In FIG. 25, a plurality of MOS transistors are formed on a P-type silicon substrate 61, a trench is provided on the silicon substrate 61 between the MOS transistors in order to electrically isolate the individual MOS transistors, and a silicon oxide 66 formed by CVD (chemical vapor deposition) is buried in the trench to form a trench portion 65.

An N-type source-drain layer 62 constituting the MOS transistor is provided in a surface of the silicon substrate 61 on both sides of the trench portion 65, a gate oxide film 63 is provided to cover the trench portion 65 and the source-drain layer 62, and a gate electrode 64 is provided from the source-drain layer 62 to a channel region.

During an operation of the MOS transistor, a depletion layer covering the source-drain layer 62 also extends to the trench portion 65 side as well as the channel region side. By the existence of the trench portion 65, it is possible to prevent a punch through from being generated between the source-drain layers 62 on both sides of the trench portion 65.

However, when the microfabrication of the semiconductor device is improved to obtain a design rule of 0.15 µm or less, a spacing between elements is reduced and the depletion layers extending from the source-drain layers 62 on both sides of the trench portion 65 shown in FIG. 25 approach each other beyond a bottom of the trench portion 65 so that a punch-through is generated between the source-drain layers 62 to easily cause a current leakage.

In order to avoid such a situation, a depth of the trench should be increased to inhibit the depletion layers from coming in contact with each other and a P-type diffusion layer having a high concentration should be provided on the outer periphery of the bottom surface of the trench portion to suppress the extension of the depletion layers. However, if the depth of the trench is increased, there is a possibility that an insulator might be buried therein with difficulty or a crystal defect might be generated in the silicon substrate due to a stress generated with the formation of the trench.

Moreover, in the case where the P-type diffusion layer is provided on the outer periphery of the bottom surface of the trench portion, an electric field in the depletion layer is increased depending on the concentration of a P-type impurity so that a junction leakage is increased by an electron trap assist tunneling phenomenon in which carriers are excited to a conduction band through a defect state in some cases.

In the structure described with reference to FIG. 25, furthermore, a positive charge is induced into the silicon oxide 66 and a negative charge is induced into the silicon substrate 61 in the vicinity of an interface between the silicon oxide 66 of the trench portion 65 and the silicon substrate 61 and a channel (a so-called side channel) using the silicon oxide 66 as a gate oxide film is generated to form a parasitic MOS transistor, resulting in the generation of a leakage current.

In the MOS transistor formed on the P-type silicon substrate, there has been known the fact that a leakage current generated between the source-drain layers with a gate voltage set to a ground level is decreased when a threshold voltage is increased. In order to raise the threshold voltage, it is preferable that a substance having a great electron affinity should be used as a gate material. This is the same as in the above-mentioned parasitic MOS transistor. By burying the substance having a great electron affinity in the silicon oxide 66 of the trench portion 65, a threshold voltage of the parasitic MOS transistor can be raised to reduce a leakage current.

As means for preventing the leakage current from being caused by a punch-through, a structure in which an electric conductor is buried in a trench portion has been proposed in addition to the above-mentioned means.

An example of a structure implementing the preventing means is illustrated in FIG. 26. Such a structure has been disclosed in Japanese Patent Application Laid-Open No. P01-138730A (1989), for example. In FIG. 26, a trench portion 55 is provided in place of the trench portion 65 shown in FIG. 25. The trench portion 55 is constituted by a silicon oxide film 56 provided on an inner surface of a trench, a compensating material layer 57 provided on an inner surface of the silicon oxide film 56, and an insulator 58 provided in a space defined by the compensating material layer 57. Other structures are the same as those in FIG. 25.

The compensating material layer 57 serves to compensate for a negative charge in a silicon substrate 61. As the compensating material layer 57 are used a substance having a great electron affinity, for example, a polysilicon layer doped with boron (B), aluminum (Al) or the like, a silicide layer such as a titanium silicide (TiSi) layer, a tungsten silicide (WSi) layer or the like, or a layer made of a refractory metal such as titanium (Ti), molybdenum (Mo) or the like.

In the structure shown in FIG. 26, however, there is a problem in that the compensating material layer 57 in the trench portion 55 is kept in a floating state, the amount of electric charges present in the compensating material layer 57 is varied depending on a manufacturing situation and a leakage current is reduced with difficulty.

The compensating material layer 57 is introduced to act as a substance to have a small work function difference between the silicon substrate 61 and the insulator 58, in other words, serves to change the characteristics of a material to fill in the trench. Accordingly, the compensating material layer 57 should be used in the floating state. However, the floating state sometimes causes electric charges to be stored in the process of manufacturing the semiconductor device such as ion implantation. Moreover, it is also supposed that the amount of electric charges is not constant and might cause a leakage current to be generated.

FIG. 27 also illustrates a structure in which an electric conductor is buried in a trench portion. The structure shown in FIG. 27 has been disclosed in Japanese Patent Application Laid-Open No. P08-172124A (1996), for example. An insulating film 77 is provided on an inner wall surface of a trench 72 formed in a semiconductor substrate 71, and a conductive film 78 is provided on an inner wall surface of the insulating film 77 and a bottom of the trench 72 and is in contact with the semiconductor substrate 71 at the bottom.

Moreover, an insulating film 79 is buried in a space defined by the conductive film 78, and an insulating film 74 is provided over the trench 72 to protrude therefrom.

In the structure shown in FIG. 27, if an electric potential of the conductive film 78 is to be fixed, it is necessary to control the electric potential of the conductive film 78 according to an electric potential of an N-type semiconductor region (not shown) present on both sides of the trench 72. However, it is hard to control the electric potential of the conductive film 78.

More specifically, in the case where an electric potential of the semiconductor substrate 71 is set to 0 V, a current does not flow between the conductive film 78 and the semiconductor substrate 71 if the electric potential of the conductive film 78 is also set to 0 V. However, in the case where the electric potential of the N-type semiconductor region present on both sides of the trench 72 is not 0V, a current flows between the conductive film 78 and the N-type semiconductor region.

Accordingly, the electric potential of the conductive film 78 should be controlled in consideration of the electric potential of the N-type semiconductor region present on both sides of the trench 72 and the electric potential of the semiconductor substrate 71. Thus, it is predicted that the control would be performed with difficulty.

Similarly, the structure in which a conductive film is provided in contact with a semiconductor substrate on a bottom of a trench has also been disclosed in Japanese Patent Application Laid-Open Nos. P06-140500A (1994) and P63-122145A (1988) which have the above-mentioned problems.

SUMMARY OF THE INVENTION

In order to solve the above-mentioned problems, it is an object of the present invention to provide a semiconductor device in which an electric potential of an electric conductor is controlled to reduce both a leakage caused by a punch-through and a junction leakage in a trench isolating structure having the electric conductor in a trench portion.

A first aspect of the present invention is directed to a semiconductor device comprising a semiconductor element formed on a semiconductor substrate and having a source-drain layer, and a trench isolating structure for electrically isolating the semiconductor element adjacently to the source-drain layer, the trench isolating structure including a trench provided in a surface of the semiconductor substrate, an electric conductor provided in the trench and having an uppermost portion in a position which is deeper than the deepest portion of the source-drain layer, an insulating film provided between a side surface of the electric conductor and the trench, and an insulator to fill in the trench on an upper portion of the electric conductor.

A second aspect of the present invention is directed to the semiconductor device, wherein the insulating film also extends between a lower main surface of the electric conductor and the semiconductor substrate.

A third aspect of the present invention is directed to the semiconductor device, further comprising a charge storage electrode, and a control system for automatically controlling an electric potential of the electric conductor, the control system comprising a first circuit portion including a first transistor of a first conductivity type having a first electrode connected to a first power source, a first resistive element having a first end connected to a second electrode of the first transistor, and a second resistive element having a first end connected to a second end of the first resistive element and a second end connected to a second power source for supplying an electric potential having a reverse polarity to the first power source, and a second circuit portion including a second transistor of a second conductivity type having a first electrode connected to the second power source, a third resistive element having a first end connected to a second electrode of the second transistor, and a fourth resistive element having a first end connected to a second end of the third resistive element and a second end grounded, wherein a control electrode of the first transistor is connected to the source-drain layer connected to the charge storage electrode, a control electrode of the second transistor is connected to the second end of the first resistive element, and the second end of the third resistive element is connected to the electric conductor.

According to the first aspect of the present invention, the amount of electric charges on a surface of the trench isolating structure can be controlled by giving a predetermined potential to the electric conductor. Therefore, a depletion layer extending from the source-drain layer of the semiconductor element isolated by the trench isolating structure can be prevented from being conducted through the periphery of the trench isolating structure to cause a punch-through state. Consequently, the generation of a current leakage can be reduced. The uppermost portion of the electric conductor is provided in the position which is deeper than the deepest portion of the source-drain layer. Therefore, an insulation between the electric conductor and the source-drain layer is improved. Thus, the controllability of the amount of the electric charges on the surface of the trench isolating structure can be enhanced by reducing a thickness of the insulating film between the side surface of the electric conductor and the trench.

According to the second aspect of the present invention, the insulating film also extends between the lower main surface of the electric conductor and the semiconductor substrate. Therefore, the electric conductor is insulated from the semiconductor substrate. When determining an electric potential of the electric conductor, it is not necessary to take an electric potential of the semiconductor substrate into consideration. Thus, the electric potential of the electric conductor can be set easily.

According to the third aspect of the present invention, in the case where electric charges are stored in the charge storage electrode, resulting in the necessity of preventing a leakage current, the electric potential of the electric conductor is automatically controlled based on an electric potential of the source-drain layer connected to the charge storage electrode. Therefore, it is possible to prevent a punch-through from being caused between the elements isolated by the trench isolating structure, thereby automatically reducing the generation of a current leakage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view illustrating a structure of a semiconductor device according to a first embodiment of the present invention;

FIGS. 3 to 16 are views illustrating the steps of manufacturing the semiconductor device according to the first embodiment of the present invention;

FIGS. 17 and 18 are views illustrating a structure of a semiconductor device according to a first variant of the first embodiment of the present invention;

FIG. 21 is a view illustrating a structure of a semiconductor device according to a fourth variant of the first embodiment of the present invention;

FIG. 22 is a sectional view illustrating a structure of a semiconductor device according to a second embodiment of the present invention;

DESCRIPTION OF THE PREFERRED EMBODIMENTS

<A. First Embodiment>

<A-1. Structure of Device>

Figure 2:
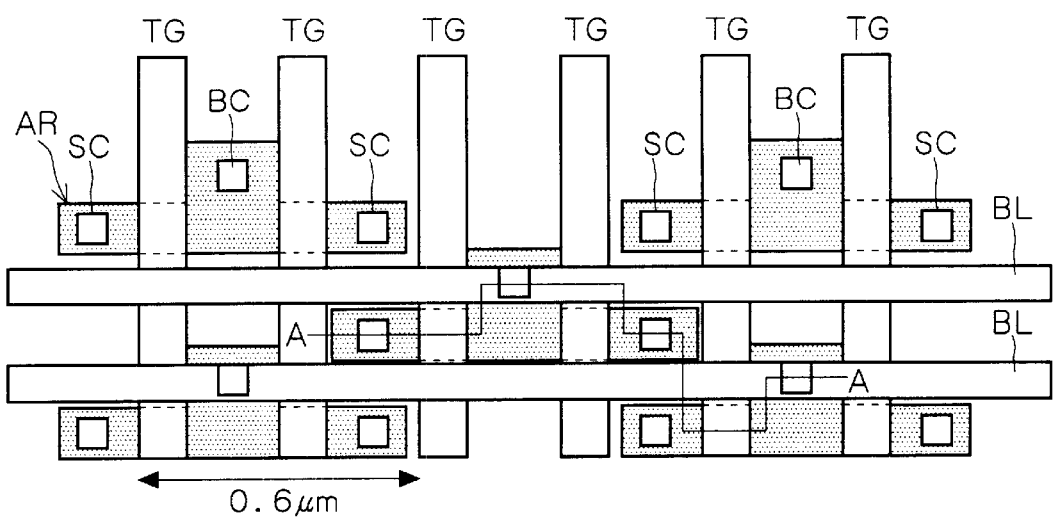
FIG. 2 is a plan view illustrating the structure of the semiconductor device according to the first embodiment of the present invention.

FIG. 1 is a partially sectional view showing a DRAM (dynamic RAM) 100 as a semiconductor device according to a first embodiment of the present invention.

FIG. 1 is a view showing a memory cell portion of the DRAM 100, in which a plurality of N-channel type MOS transistors are formed on a P-type silicon substrate 1 and a trench isolating structure 20 is provided on the silicon substrate 1 between the N-channel type MOS transistors to electrically isolate the MOS transistors.

The trench isolating structure 20 has such a structure that an insulating film 4 (for example, a silicon oxide film) is provided on an inner surface of a trench provided in the silicon substrate 1 and doped polysilicon doped with phosphorus (P) in a concentration of approximately $1 \times 10^{20}/cm^3$ is buried as an electric conductor 3 in a lower side of a trench space defined by the insulating film 4.

For example, a silicon oxide is buried as an insulator 2 in an upper side of the trench space. The silicon oxide to be used may be a TEOS (tetra ethyl orthosilicate) oxide film, a HDP (High Density Plasma) oxide film or a SiOF (fluorine added oxide) film having a small dielectric constant.

By using such a substance having a small dielectric constant, a gate capacity of a transfer gate formed in an upper portion of the trench isolating structure 20 can be reduced, a rise delay time of a gate potential can be shortened and a fluctuation in an electric potential can be suppressed.

The electric conductor 3 is electrically connected to the outside by a contact (not shown) which penetrates the insulator 2, and receives an optimal potential according to an impurity concentration of the source-drain layer, the shape of the trench and the like. The electric potential to be given to the electric conductor 3 will be described below.

<A-1-1. Structural Characteristic of Trench Isolating Structure 20>

The trench isolating structure 20 has such a structure that the electric conductor 3 is buried in the lower side of the trench and the insulator 2 is buried in the upper side of the trench. Such a structure is effective in that the gate capacity of the transfer gate formed in the upper portion of the trench isolating structure 20 can be reduced.

A gate oxide film of a gate electrode of an ordinary MOS transistor has a thickness of 2 to 10 nm. It is necessary to avoid that the gate capacity of the transfer gate formed in the upper portion of the trench isolating structure 20 is greater than a gate capacity of a gate electrode.

For this purpose, it is desirable that a thickness of the insulator 2 should be ten times as much as the thickness of the gate oxide film or more, for example, 100 nm or more. In this respect, the insulator 2 is buried in the upper side of the trench isolating structure 20. Therefore, the thickness of the insulator 2 can be sufficiently increased. Consequently, it is possible to reduce the gate capacity of the transfer gate formed on the upper portion of the trench isolating structure 20 to one tenth of the whole gate capacity or less.

The structure of FIG. 1 will be described again.

A plurality of N-type lightly doped drain layers (hereinafter referred to as LDD layers) 7 having a relatively low concentration and a plurality of N-type source-drain layers having a relatively high concentration which constitute a MOS transistor are provided in a surface of the silicon substrate 1 on both sides of the trench isolating structure 20.

For convenience of the following description of an operation, a source-drain layer S1 is provided on the leftmost part of the drawing, a source-drain layer D1 is provided on the left of the trench isolating structure 20, a source-drain layer D2 is provided on the right of the trench isolating structure 20, and a source-drain layer S2 is provided on the rightmost part of the drawing.

A gate oxide film 5 is provided to cover the LDD layer 7, the source-drain layers D1, S1, D2 and S2 and the trench isolating structure 20, and a gate electrode 6 is provided to cover a channel region between tops of edge portions of the LDD layers 7 which are opposed to each other.

By implanting nitrogen ions in the insulating film 4 formed of a silicon oxide film or using a SiON film (a silicon oxynitride film) in place of the silicon oxide film, impurity diffusion from the electric conductor 3 formed of doped polysilicon to the silicon substrate 1 can be suppressed or an interface state on an interface and a crystal defect can be prevented from being generated.

<A-1-2. Setting of Thickness of Insulating Film 4>

The source-drain layer adjacent to the trench isolating structure 20 and the electric conductor 3 are to be kept apart from each other by at least 10 nm or more. For this purpose, a thickness of the insulating film 4 of the trench isolating structure 20 should be set to approximately 10 nm (100 angstrom) and the uppermost surface of the electric conductor 3 should be provided in a position which is deeper than the deepest portion of the source-drain layer. In consideration of the controllability of the amount of electric charges on a surface of the trench isolating structure 20, the thickness of the insulating film 4 is set to approximately 20 nm at the maximum.

With this structure, it is possible to prevent the insulating film (silicon oxide film) 4 from being broken down by an electric field between the source-drain layers D1 and D2 which are adjacent to the trench isolating structure 20 and the electric conductor 3.

A dielectric breakdown of the silicon oxide film which is caused by an electric field has three modes. More specifically, the three modes include an A mode in which a short-circuit is caused by a damage such as a pin hole at a breakdown electric field EBD of 1 MV/cm or less, a B mode caused by a weak spot due to some defect at a breakdown electric field EBD of 1 MV/cm<EBD<8 MV/cm and a C mode in which a leakage current is generated by a Fowler-Nordheim type tunnel current at a breakdown electric field EBD of 8 MV/cm or more.

In general, the quality of the silicon oxide film is represented by a frequency occupied in the C mode. The insulating characteristic of the silicon oxide film of high quality is set to a 100% C mode. On the other hand, a breakdown in the B mode is permanent and the silicon oxide film broken down in the B mode presents the A mode by remeasurement. Accordingly, the breakdown in the B mode is to be noted and the thickness of the silicon oxide film is set so as not to cause the breakdown in the B mode.

As will be described below, in the case where the electric potential of the electric conductor 3 is set to −1.0 V and that of the source-drain layer D1 is set to 1.0 V, for example, a voltage of 2 V is applied therebetween. The breakdown in the B mode is actually generated at 3 MV/cm or more. If a critical electric field is set to 3 MV/cm, the thickness of the insulating film 4 has the following limit:

$$2V \div 3 \text{ MV/cm} = 0.666 \times 10^6 \text{ cm} = 6.7 \text{ nm}.$$

This value is obtained with the source-drain layer D1 having an electric potential of 1.0 V, that is, a supply voltage of 1.0 V. If the supply voltage is set to 1.5 V and the electric potential of the electric conductor 3 is set to −1.5 V, the limit of the thickness of the insulating film 4 is 10 nm. If the supply voltage is set to 2.0 V and the electric potential of the electric conductor 3 is set to −2.0 V, the thickness of the insulating film 4 has a limit of 13.3 nm.

Assuming that the supply voltage is 1.5 V in consideration of the breakdown in the B mode, the thickness of the insulating film 4 is set to approximately 10 nm. The thickness of the insulating film 4 should be increased with a rise in the supply voltage.

The thickness of the insulating film 4 which is as small as possible can enhance the controllability of the amount of electric charges in the vicinity of the surface of the trench isolating structure 20. Therefore, it is desirable that the insulating film 4 should be formed as thinly as possible in consideration of the above-mentioned dielectric breakdown.

In this respect, the insulating properties of the electric conductor 3 and the source-drain layer can be enhanced and the thickness of the insulating film 4 can be reduced to the limit in the trench isolating structure 20 in which the electric conductor 3 is provided such that the uppermost surface of the electric conductor 3 is placed in a deeper position than the deepest portion of the source-drain layer.

While the insulating film 4 is formed along the inner surface of the trench and is provided to surround a side surface and a lower main surface of the electric conductor 3, the lower main surface of the electric conductor 3 may be provided in contact with the silicon substrate 1. In that case, the electric potential of the electric conductor 3 is to be determined in consideration of the electric potential of the silicon substrate 1.

The structure of FIG. 1 will be described again.

A P-type impurity region 12 having a relatively high concentration (approximately $1 \times 10^{17}/\text{cm}^3$) is provided to surround a bottom of the trench isolating structure 20 in the silicon substrate 1 in the vicinity of a bottom surface of the trench isolating structure 20. The P-type impurity region 12 serves to suppress the extension of a depletion layer from the source-drain layer on both sides of the trench isolating structure 20.

Moreover, an impurity region 13 is present to surround the source-drain layers D1 and D2 on both sides of the trench isolating structure 20. As will be described below, the impurity region 13 is provided in order to place an N-type region covering the source-drain layers D1 and D2 to reach a deeper position, thereby relaxing an electric field.

The gate electrodes 6 form a part of the transfer gate, and are constituted by a polysilicon layer, a metal silicide layer such as a tungsten silicide (WSi) layer, a titanium silicide (TiSi) layer or the like, or a metal layer such as tungsten (W), aluminum (Al) or the like and are provided in parallel with each other. A transfer gate TG is also provided on the trench isolating structure 20.

Moreover, a bit line BL is provided above the transfer gate TG and is constituted by a polysilicon layer, a metal silicide layer such as a tungsten silicide layer, a titanium silicide layer or the like, or a metal layer such as tungsten, aluminum or the like. The direction of arrangement is orthogonal to the transfer gate TG as seen on a plane.

The source-drain layers D1 and S2 and the bit line BL are electrically connected through a bit line contact BC.

As shown in FIG. 1, an interlayer insulating film 10 is provided to cover the silicon substrate 1 and a structure related to the MOS transistor including the bit line BL is buried in the interlayer insulating film 10.

A storage node SN is provided on the interlayer insulating film 10. The storage node SN is electrically connected to the source-drain layers S1 and D2 through a storage node contact SC.

The storage node SN is equivalent to one of two electrodes constituting a capacitor which is connected to the source-drain layer of the MOS transistor. The capacitor is constituted by a cell plate (not shown) which makes a pair with the storage node SN and acts as the other electrode of the capacitor and an insulating film having a thickness of several nm which is provided between the storage node SN and the cell plate.

Although the storage node SN has various shapes referred to as an interior type and an exterior type as well as a general stack flattening type, they are hardly related to the present invention and their detailed description will be omitted.

A semiconductor memory having a storage node stores binary data of 0 or 1, wherein "1" represents the case where electric charges are stored in the storage node and "0" represents the case where the electric charges are not stored in the storage node. The stored electric charges gradually leak. In that state, therefore, stored data are lost. For this reason, it is necessary to supply electric charges to the storage node SN at a predetermined time interval, thereby causing an electric potential to have an original value. This is a refresh operation. During the refresh operation, a memory cell cannot be accessed from the outside. Therefore, if a time interval from the refresh operation to the next refresh operation is increased, the performance of the DRAM is enhanced.

With reference to FIG. 2, description will be given to an example of a mask pattern for forming the DRAM 100 shown in FIG. 1. FIG. 2 is a plan view showing a state in which all of a mask pattern for forming an active region (an element formation region) AR where a semiconductor element such as a MOS transistor is to be formed, a mask pattern for forming a transfer gate TG and a mask pattern for forming a bit line BL are superposed. A design rule (L/S) of a wiring width (line: L) of the transfer gate TG and an arrangement space (space: S) is 0.15 μm/0.15 μm, and a design rule (L/S) of the bit line BL is 0.1 μm/0.2 μm.

The trench isolating structure is formed to surround the active region AR, and a sectional shape taken along the line A—A in FIG. 2 is equivalent to the structure shown in FIG. 1.

<A-2. Operation of Device>

Next, an operation of the DRAM shown in FIG. 1 will be described. First of all, the conditions of a leakage current flow are as follows.

Electric potential of substrate=0 V,
Electric potential of source-drain layer S1=0 V,
Electric potential of source-drain layer D1=0 V,
Electric potential of source-drain layer D2=1.5 V, and
Electric potential of source-drain layer S2=1.5 V.

Under such a condition, two kinds of leakage mechanisms are supposed.

One of the leakage mechanisms is a leakage on a PN junction between the silicon substrate 1 and the source-drain layer D2, and the other leakage mechanism is a leakage caused by a punch-through between the source-drain layer D2 and the source-drain layer D1 (which will be hereinafter referred to as a surface punch-through).

Referring to the leakage on the PN junction, it is supposed that a diffusion current flows in a PN junction portion or carriers are excited to a conduction band through a defect state (an electron trap assist tunneling phenomenon) and leak. If an electric field in a depletion layer on the PN junction portion is great, a leakage current is increased. Therefore, the impurity region 13 shown in FIG. 1 is provided to reduce an impurity concentration in the junction portion and to cause the depletion layer to extend. Thus, the electric field is reduced.

In particular, a defect is often generated on an interface between the trench isolating structure and the silicon substrate. In this portion, it is necessary to reduce an electric field. However, if an impurity concentration is reduced in the vicinity of the interface, the depletion layer excessively extends so that a leakage current caused by the surface punch-through is increased.

Accordingly, the electric potential of the electric conductor 3 in the trench isolating structure 20 is set to −1.0 V, thereby reducing an electron concentration on an interface between the silicon substrate 1 and the trench isolating structure 20. Consequently, it is possible to prevent the current leakage from being caused by the surface punch-through.

More specifically, if the electric potential of the electric conductor 3 is set negative, electrons in the vicinity of the trench isolating structure 20 receive force in such a direction as to get away from the trench isolating structure 20 and holes are conversely attracted. Therefore, the electron concentration on the interface between the silicon substrate 1 and the trench isolating structure 20 is reduced.

In the case where a reverse bias of 1.0 V is applied to the PN junction, the following relationship between a depletion layer width and an electric field for an impurity concentration of the P-type impurity region 12 is obtained.

For an impurity concentration of $1\times10^{18}/cm^3$, a depletion layer width of 0.03 μm and an electric field of $3.3\times10^5$ V/cm are obtained.

For an impurity concentration of $1\times10^{17}/cm^3$, a depletion layer width of 0.1 μm and an electric field of $1.0\times10^5$ V/cm are obtained.

For an impurity concentration of $1\times10^{16}/cm^3$, a depletion layer width of 0.3 μm and an electric field of $0.33\times10^5$ V/cm are obtained.

In an element having a design rule of 0.15 μm or less, a width of the trench isolating structure is 0.15 μm or less. Therefore, the depletion layer extends from the source-drain layer on both sides of the trench isolating structure 20 to prevent a punch-through from being caused. From this viewpoint, the impurity concentration of the P-type impurity region 12 is set lower than an impurity concentration of $1\times10^{17}/cm^3$ at which the depletion layer width is approximately 0.1 μm and the electric potential of the electric conductor 3 is set to −1.0 V.

In a P-channel type MOS transistor having a P-type source-drain layer, the electric potential of the electric conductor 3 is set positive.

<A-3. Manufacturing Method>

A method of manufacturing the DRAM 100 will be described with reference to FIGS. 3 to 16 which are sectional views sequentially showing the manufacturing steps.

Figure 3:
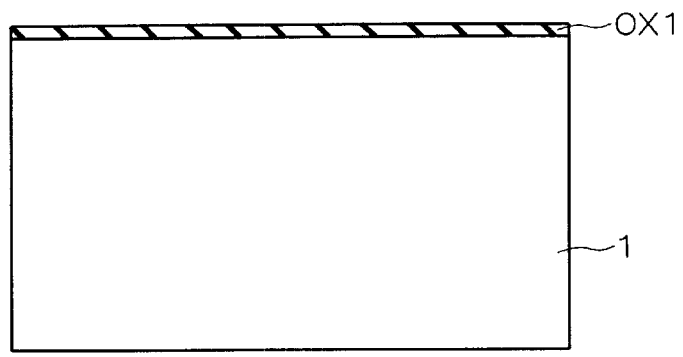

At the step shown in FIG. 3, first of all, a main surface of a silicon substrate 1 is wholly oxidized to form a silicon oxide film OX1 having a thickness of 10 to 30 nm.

Figure 4:
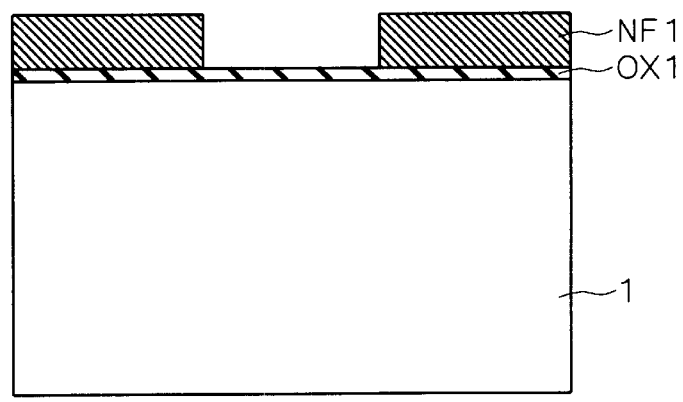

At the step shown in FIG. 4, next, a silicon nitride film is formed on the silicon oxide film OX1 and a trench isolating pattern is patterned by photolithography. Consequently, a mask NF1 for trench formation is provided.

Figure 5:
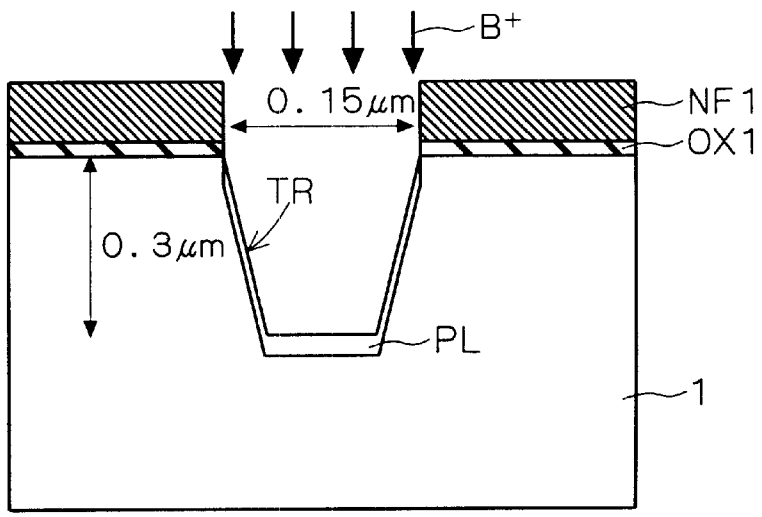

At the step shown in FIG. 5, then, the silicon oxide film OX1 and the silicon substrate 1 are selectively subjected to etching by using the mask NF1 for trench formation, thereby forming a trench TR taking a sectional shape of an inverted trapezoid which has a greater opening area than the area of a bottom surface. Thereafter, boron ($B^+$) ions are implanted to form a P-type impurity layer PL on the bottom surface of the trench TR.

The shape of the trench TR is the inverted trapezoid for the following reason. When an electric conductor or an insulator is to be buried, a CVD method is used. In an upper portion of the trench TR, more deposition substances are supplied and a deposition speed is higher than in a lower portion thereof. Therefore, it is necessary to prevent the upper portion of the trench TR from being filled in earlier to generate a hollow portion referred to as a void in the trench TR. Of course, if the generation of the void can be prevented, the shape of the trench TR is not restricted to the inverted trapezoid.

Moreover, a depth of the trench TR is varied depending on a semiconductor device to which the present invention is applied, and ranges from 100 nm to 1000 nm. In the present embodiment, the depth of the trench TR is set to approximately 300 nm (0.3 μm).

In the present embodiment, furthermore, it is assumed that a design rule is set to 0.15 μm and an opening dimension of the trench TR is set to approximately 0.15 μm.

Figure 6:
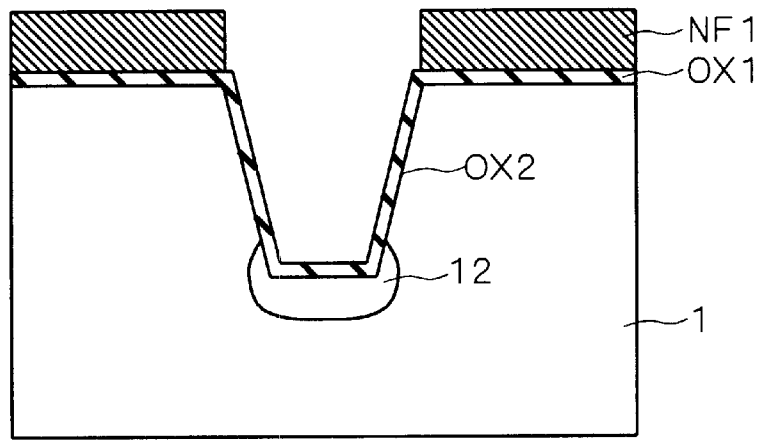

At the step shown in FIG. 6, subsequently, a wall surface of the trench TR is thermally oxidized to form a silicon oxide film OX2 having a thickness of approximately 10 nm. At this time, a P-type impurity layer PL on the bottom surface of the trench TR is diffused to form a P-type impurity region 12 having a concentration of approximately $1\times10^{17}/cm^3$.

Figure 7:
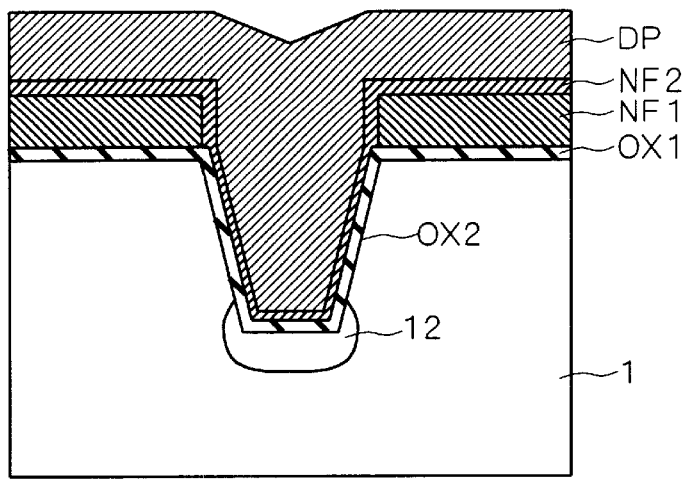

At the step shown in FIG. 7, next, a silicon nitride film NF2 having a thickness of approximately 10 nm is wholly formed to cover the silicon oxide film OX2 on the wall surface of the trench TR. Then, a doped polysilicon layer DP doped with phosphorus in a concentration of approximately $1\times10^{20}/cm^3$ is wholly formed by the CVD method, for example, thereby filling in the trench TR.

Figure 8:
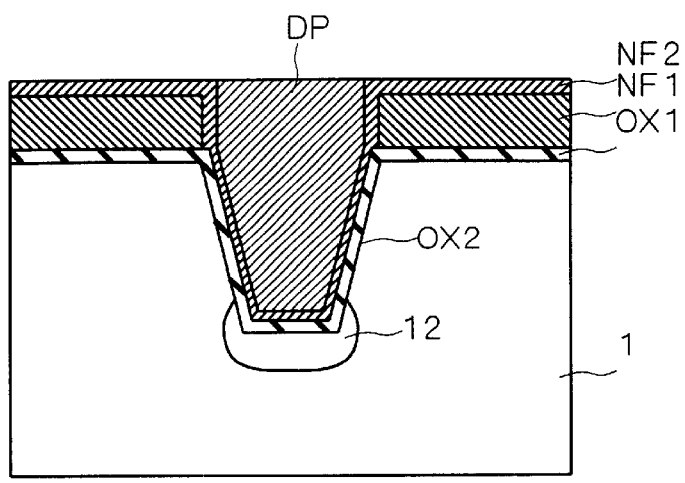

At the step shown in FIG. 8, thereafter, the doped polysilicon layer DP is removed by planarization using CMP (Chemical Mechanical Polishing) until the silicon nitride film NF2 provided on the mask NF1 for trench formation is exposed.

Figure 9:
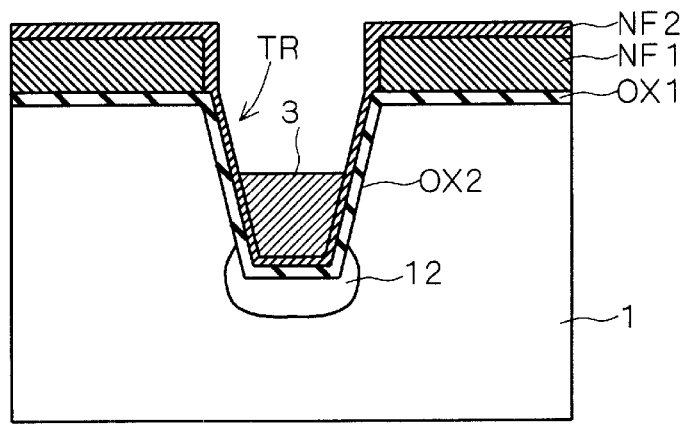

At the step shown in FIG. 9, subsequently, the doped polysilicon layer DP in the trench TR is removed by anisotropic dry etching to cause the doped polysilicon layer DP to remain on a lower side in the trench TR. The remaining doped polysilicon layer DP constitutes an electric conductor 3.

As described above, an insulator 2 to be buried after the removal of the doped polysilicon layer DP needs to have a thickness of at least 100 nm. Therefore, the amount of the removal of the doped polysilicon layer DP is set to approximately 100 nm from an opening face of the trench TR, that is, a surface of the silicon substrate 1.

Figure 10:
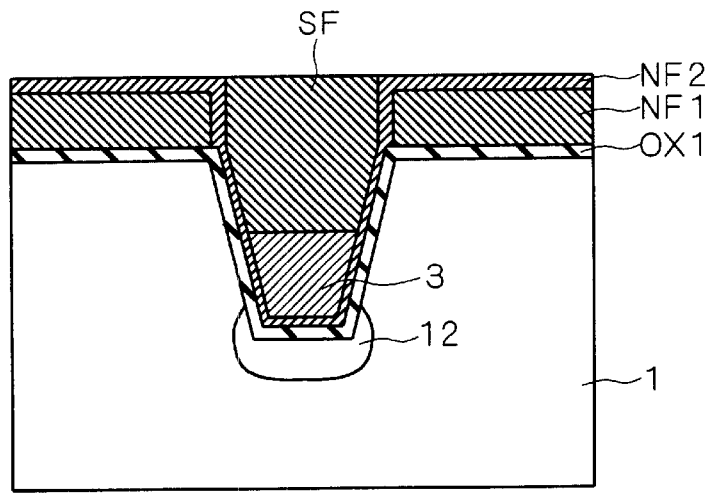

At the step shown in FIG. 10, next, an upper portion of the electric conductor 3 is filled with a SiOF film (fluorine added oxide film) SF, for example. The SiOF film is wholly formed by low temperature CVD, for example, and an unnecessary portion is planarized and removed by the CMP.

Figure 11:
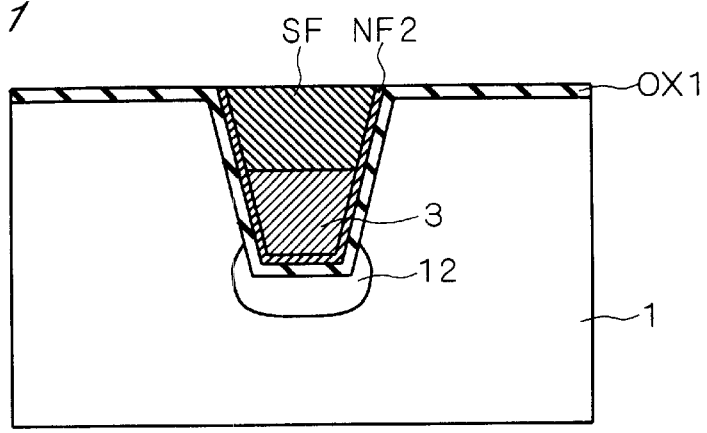

At the step shown in FIG. 11, then, the SiOF film SF is removed by the anisotropic dry etching up to a depth which almost corresponds to a position of a main surface of the silicon substrate 1. Thereafter, the mask NF1 for trench formation is removed by etching to planarize the surface. In place of these steps, the planarization may be carried out by the CMP. Subsequently, the SiOF film SF is vitrified at a low temperature and a high pressure.

Figure 12:
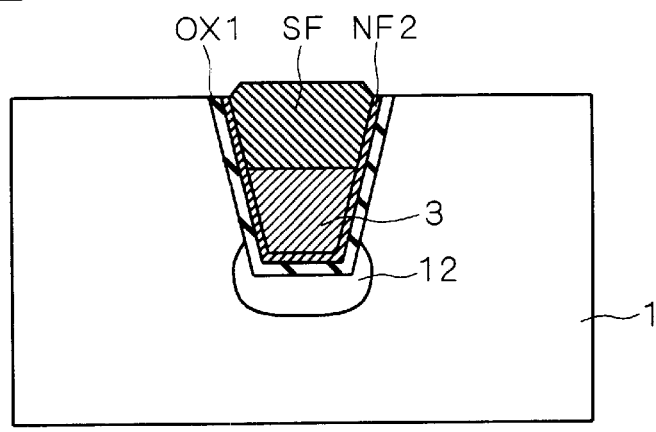

At the step shown in FIG. 12, next, the silicon oxide film OX1 provided on the surface of the silicon substrate 1 is removed by etching to expose the surface of the silicon substrate 1. At this time, a difference is made between an etching rate of the silicon oxide film OX1 and that of the SiOF film SF. Consequently, the SiOF film SF slightly protrudes from the main surface of the silicon substrate 1.

Figure 13:
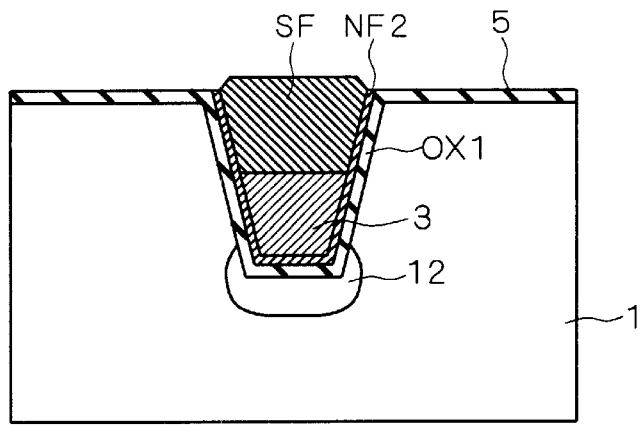

At the step shown in FIG. 13, then, a gate oxide film 5 having a thickness of 2 to 10 nm is formed of $SiO_2$ or SiON (silicon oxynitride) on the silicon substrate 1. The SiON is formed by LP (low pressure) CVD at a temperature of 700 to 750° C. by mixing $N_2O$ with $Si_2H_2Cl_2$.

Figure 14:
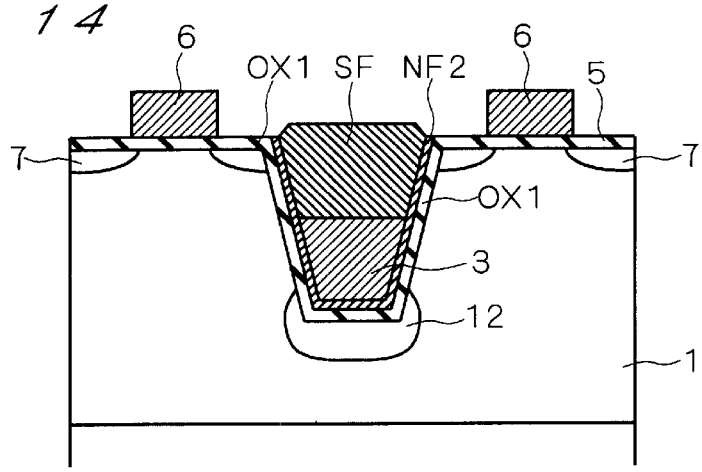

At the step shown in FIG. 14, subsequently, a gate electrode 6 is selectively formed of polysilicon or tungsten silicide (WSi) on the gate oxide film 5. Then, phosphorus ions are implanted in a concentration of $1 \times 10^{16}$ to $1 \times 10^{17}/cm^3$ by using the gate electrode 6 as a mask. Consequently, an LDD layer 7 is formed.

Figure 15:
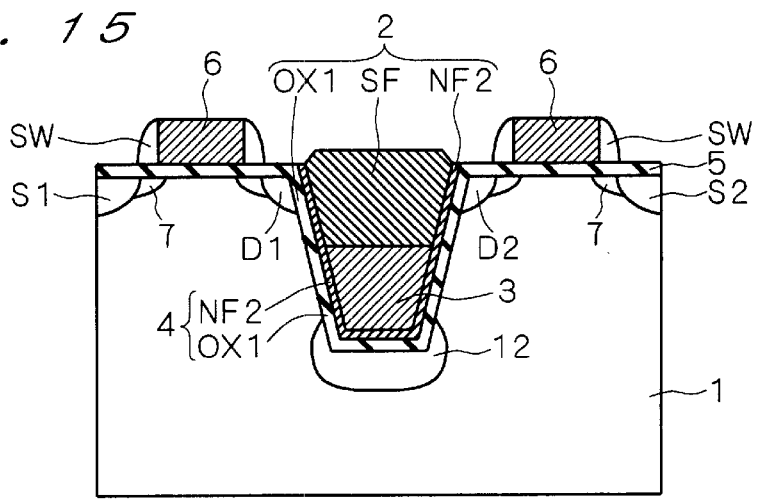

At the step shown in FIG. 15, next, a silicon nitride film is wholly formed. Then, the silicon nitride film is removed by anisotropic etching to form a side wall insulating film SW on a side surface of the gate electrode 6. Thereafter, arsenic (As) ions are implanted in a concentration of approximately $1 \times 10^{17}/cm^3$ by using the side wall insulating film SW as a mask. Consequently, source-drain layers S1, D1, D2 and S2 are formed. In a memory cell of the DRAM or the like, the arsenic ion implantation is not carried out in order to reduce an electric field in a junction portion and the LDD layer is substituted for the source-drain layer in some cases.

At the step shown in FIG. 16, subsequently, a TEOS film or a BPSG (boro-phospho silicate glass) film is wholly provided to form an interlayer insulating film 10. A bit line BL is buried in the interlayer insulating film 10, and a bit line contact BC reaching the source-drain layers D1 and S2 from the bit line BL is formed.

Then, a storage node contact (not shown) reaching the source-drain layers S1 and D2 through the interlayer insulating film 10 is formed and a storage node (not shown) is formed on the interlayer insulating film 10. Consequently, the structure of the DRAM 100 shown in FIG. 1 is obtained.

In FIG. 16, an insulating film 4 is constituted by the silicon oxide film OX1 and he silicon nitride film NF2, and an insulator 2 is constituted by the SiOF film SF, the silicon oxide film OX1 and the silicon nitride film NF2.

<A-4. Action and Effects>

As described above, according to the first embodiment, the trench isolating structure 20 has the electric conductor 3 buried in the lower side of the trench to give a negative potential to the electric conductor 3. By reducing the electron concentration on the interface between the silicon substrate 1 and the trench isolating structure 20, therefore, it is possible to prevent a punch-through between the MOS transistors isolated by the trench isolating structure 20, thereby reducing the generation of a current leakage.

Moreover, the insulator 2 having a small dielectric constant is buried in the upper side of the trench. Consequently, a capacity of the transfer gate TG provided on the trench isolating structure 20 can be reduced, a rise delay time of a gate potential can be shortened and a fluctuation in an electric potential can be suppressed.

Furthermore, the insulating film having a thickness of approximately 10 nm is provided between the electric conductor 3 and the silicon substrate 1. Consequently, the source-drain layers D1 and D2 and the electric conductor 3 can be kept apart from each other by at least 10 nm or more. Thus, it is possible to prevent the insulating film 4 from being broken down by an electric field between the source-drain layers D1 and D2 and the electric conductor 3.

<A-5. First Variant>

While the example in which the electric conductor 3 is constituted by the doped polysilicon doped with phosphorus has been described in the first embodiment according to the present invention, the material of the electric conductor 3 is not restricted to the doped polysilicon but a metallic material 31 such as tungsten (W), copper (Cu), aluminum (Al) or the like which is shown in FIG. 17 or a silicide 32 such as tungsten silicide (WSi), cobalt silicide (CoSi), titanium silicide (TiSi) or the like which is shown in FIG. 18 may be used. In FIGS. 17 and 18, the same structures as those shown in FIG. 9 have the same reference numerals.

In consideration of a heat treatment in the subsequent manufacturing steps, W, Cu, WSi, CoSi and TiSi which have high melting points are effective. In the case where the metallic material 31 such as W or Cu is to be used, an insulating film such as $SiO_2$, SiN, SiON or the like is formed between the metallic material 31 and the silicon substrate 1, and furthermore, a metal nitride film such as a TiN film or a TaN film is formed as a barrier metal film NM between the insulating film and the metallic material 31 as shown in FIG. 17. Consequently, it is possible to prevent metal atoms from being diffused into the silicon substrate 1 through the insulating film and from generating a spike-shaped protrusion on the insulating film. Thus, the cause of a current leakage can be reduced.

<A-6. Second Variant>

Figure 19:
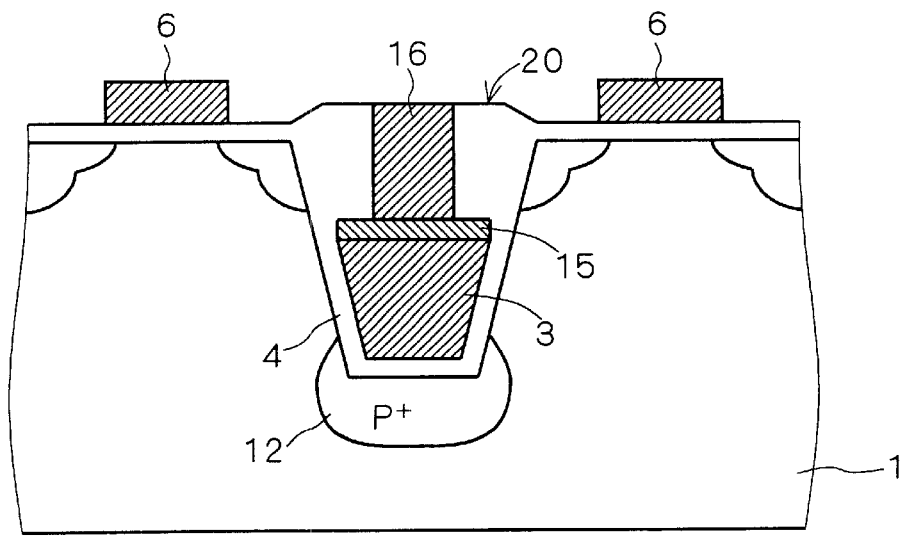
FIG. 19 is a view illustrating a structure of a semiconductor device according to a second variant of the first embodiment of the present invention.

In the first embodiment according to the present invention described above, the electric conductor 3 has been electrically connected to the outside through the contact portion penetrating the insulator 2. In this case, such a structure as to bury the same doped polysilicon as the electric conductor 3 is employed in the contact portion. In the case where the electric conductor 3 is constituted by the metallic material 31 or the silicide 32 as described above, it is preferable that a TiN film 15 should be provided between the electric conductor 3 and the contact portion 16 as shown in FIG. 19. The TiN film 15 can act as a barrier metal to suppress a reaction of silicon to the metallic material 31 and to prevent the metal atoms from being diffused into a contact portion 16 in which the doped polysilicon is buried. The contact portion 16 and the source-drain layer should be kept apart from each other by 10 nm or more. In place of the TiN film 15, a TaN film or any metal nitride film may be used.

<A-7. Third Variant>

Figure 20:
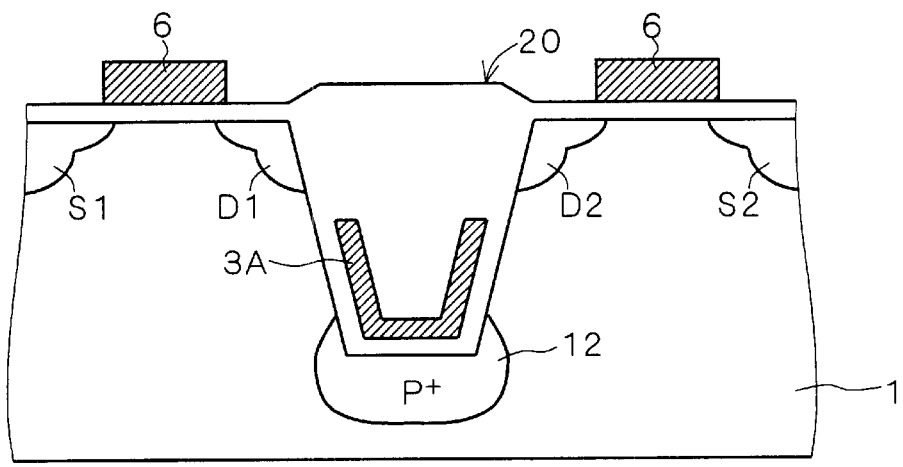
FIG. 20 is a view illustrating a structure of a semiconductor device according to a third variant of the first embodiment of the present invention.

While the structure in which the electric conductor 3 is buried in the lower side of the trench has been used for the trench isolating structure 20 in the first embodiment of the present invention described above, a conductive film 3A may be formed on an inner side wall of an insulating film 4 provided on an inner surface of a trench as shown in FIG. 20. With such a structure, a thickness of an insulator 2 is more increased. Consequently, if a transfer gate TG is formed on the trench isolating structure 20, a gate capacity of the transfer gate TG can be reduced still more.

The conductive film 3A is formed in a lower side of the trench in the same manner as the electric conductor 3.

<A-8. Fourth Variant>

While the structure of the DRAM formed on a bulk silicon substrate has been described in the first embodiment of the present invention, the same trench isolating structure can also be applied to the case where a DRAM is to be formed on a SOI (silicon on insulator) substrate.

More specifically, a buried oxide film BX is provided on a silicon substrate 1 and a SOI layer SO is provided on the buried oxide film BX, thereby constituting a SOI substrate 1A as shown in FIG. 21. A trench isolating structure 20 is provided in a surface of the SOI layer SO.

If a thickness of the SOI layer SO approximates to a depth of the trench isolating structure 20, a distance from a bottom surface of the trench isolating structure 20 to the buried oxide film BX is reduced and a silicon portion is narrow. Therefore, it is possible to obtain the effect of suppressing a punch-through without implanting P-type impurity ions. Of course, a P-type impurity region 12 is provided as shown in FIG. 1 so that it is possible to further enhance the effect of suppressing a punch-through in addition to the effect of making the silicon portion narrow.

<A-9. Fifth Variant>

In the first embodiment of the present invention described above, the impurity concentration of the P-type impurity region 12 has been set lower than an impurity concentration of $1\times10^{17}/cm^3$ at which a depletion layer width is approximately 0.1 μm and the electric potential of the electric conductor 3 has been set to −1.0 V. Although the electric potential of the electric conductor 3 has been set to −1.0 V at a design stage and could not be changed, electric potential supply means for variably giving an electric potential to the electric conductor 3 may be provided in such a manner that the electric potential of the electric conductor 3 can be changed optionally.

With such a structure, the electric potential of the electric conductor 3 can be optimized for each chip according to refresh characteristics, for example.

<B. Second Embodiment>

<B-1. Structure of Device>

FIG. 22 is a partially sectional view showing a DRAM 100A as a semiconductor device according to a second embodiment of the present invention. In FIG. 22, the same structures as those of the DRAM 100 shown in FIG. 1 have the same reference numerals and repetitive description will be omitted.

In FIG. 22, the DRAM 100A has an automatic potential control system AS for automatically controlling an electric potential of an electric conductor 3.

The automatic potential control system AS serves to automatically set the electric potential of the electric conductor 3 based on an electric potential of a source-drain layer, and is connected to a power source Vcc and to a source-drain layer D2 and the electric conductor 3.

Figure 23:
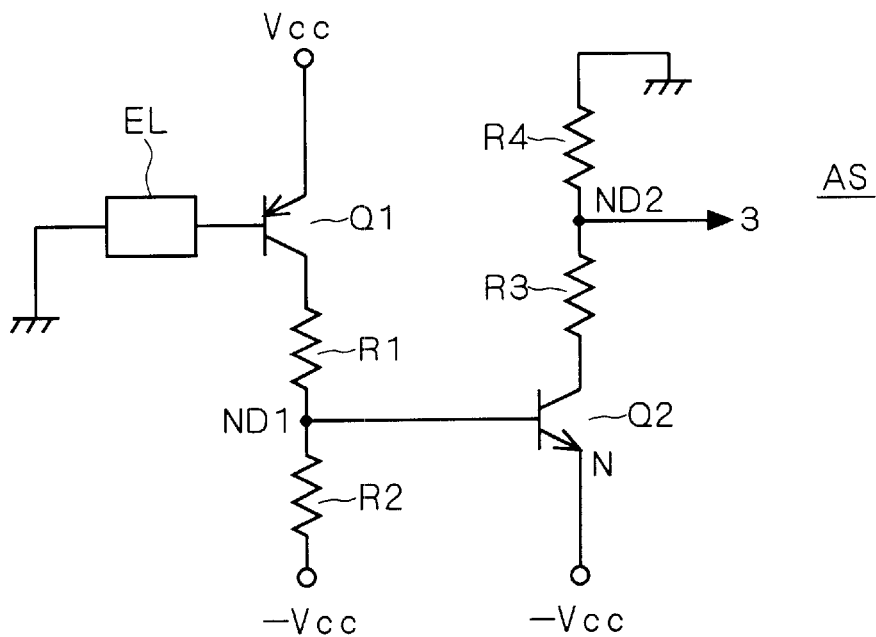
FIG. 23 is a diagram illustrating a structure of an automatic potential control system of the semiconductor device according to the second embodiment of the present invention.

FIG. 23 shows an example of a structure of the automatic potential control system AS. In FIG. 23, a PNP bipolar transistor Q1 has an emitter connected to a power source PS1 for supplying an electric potential Vcc and a collector connected to one of ends of a resistor R1. The other end of the resistor R1 is connected to one of end of a resistor R2. Ie other end of the resistor R2 is connected to a power source PS2 for supplying a negative potential −Vcc which is reverse to the power source PS1. The PNP bipolar transistor Q1 has a connected to an element E1, that is a source-drain layer 12 of a MOS transistor shown in FIG. 22. The source-drain layer D2 is a semiconductor layer to be connected to a storage node SN (see FIG. 1). When electric charges are stored in the storage node SN through the source-drain layer A2, the PNP bipolar transistor Q1 is brought into an ON state.

An NPN bipolar transistor Q2 has an emitter connected to a power source PS2 and a collector connected to one of ends of a resistor R3. The other end of the resistor R3 is connected to one of ends of a resistor R4. The other end of the resistor R4 is connected to a ground potential. The NPN bipolar transistor Q2 has a base connected to a node ND1 of the resistors R1 and R2. A node ND2 of the resistors R3 and R4 is connected to the electric conductor 3.

<B-2. Operation of Device>

Next, an operation of the automatic potential control system AS will be described.

In the case where the element EL is not set to have a predetermined potential, that is, the PNP bipolar transistor Q1 is off, a current does not flow between en the power sources PS1 and PS2. Since the electric potential of the node ND1 is −Vcc, the NPN bipolar transistor Q2 is not turned on and a current does not flow between a ground and the power source PS2 Accordingly, the node ND2, that is, the electric conductor 3 has an electric potential of 0 V.

To the contrary, in the case where electric charges are stored in the storage node SN through the source-drain layer D2, that is, the PNP bipolar transistor Q1 is brought into an ON state, a current flows between the power sources PS1 and PS2 so that the electric potential of the node ND1 becomes higher than −Vcc and a current flows between the node ND1 and the power source PS2. Accordingly, a current flows between the ground and the power source PS2. Consequently, the electric potential of the node ND2, that is, the electric potential of the electric conductor 3 is reduced to −Vcc·R4/(R3+R4) at a ratio of resistance values of the resistors R3 and R4.

It is preferable that the automatic potential control system AS should be provided in a peripheral circuit or the like which constitutes the DRAM.

Figure 24:
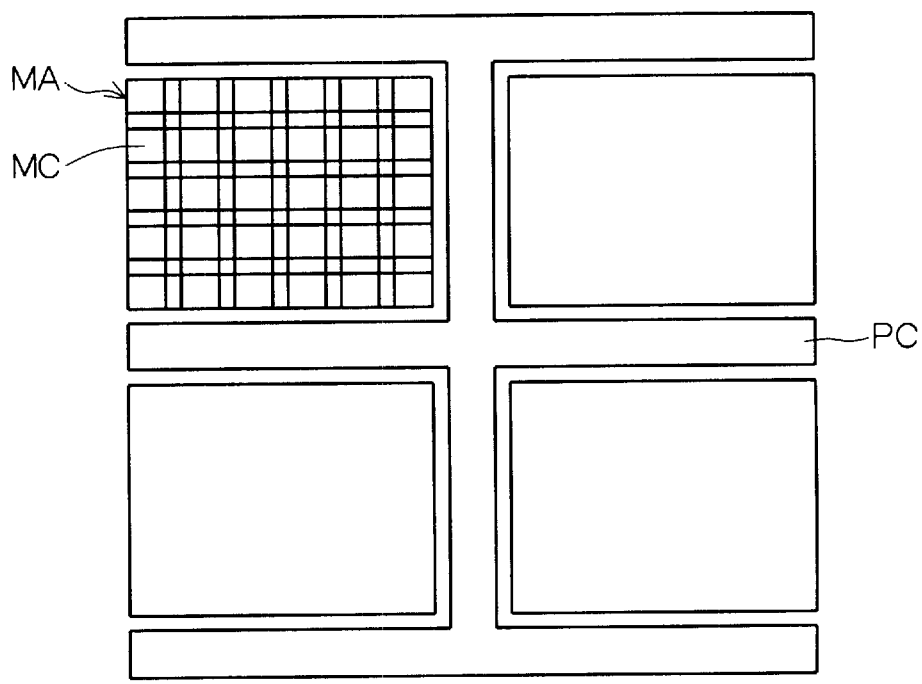
FIG. 24 is a view illustrating a general structure of a DRAM.
Figure 25:
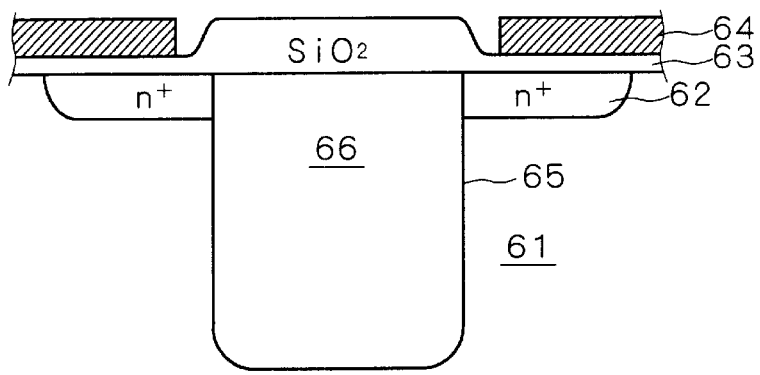
FIGS. 25 to 27 are views illustrating a structure of a trench isolating structure according to the prior art.
Figure 26:
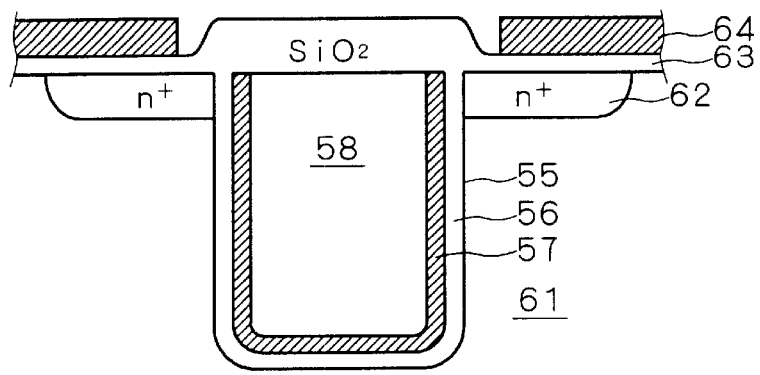
Figure 27:
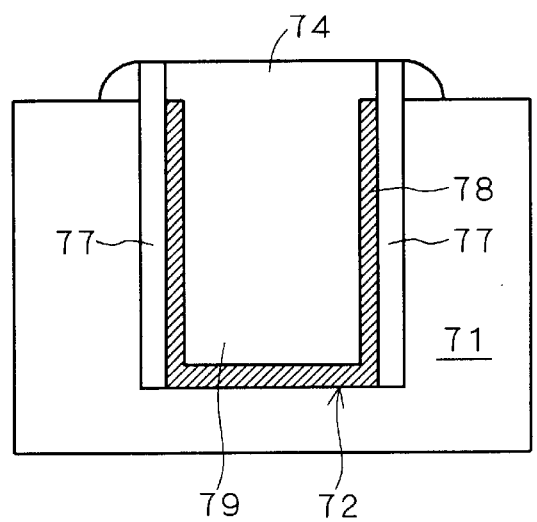

More specifically, the DRAM comprises a memory cell array MA constituted in an array of a plurality of memory cells MC and a peripheral circuit PC provided on the periphery of the memory cell array MA and including a row decoder and a column decoder, a sense amplifier and the like as shown in FIG. 24. An element isolating film such as the trench isolating structure 20 is connected in common including the memory cell MC and the peripheral circuit PC. Therefore, the structure shown in FIG. 22 can be obtained by connecting the automatic potential control system AS to the electric conductor 3 in the peripheral circuit PC.

<B-3. Action and Effect>

In the case where the electric charges are stored in the storage node SN so that a leakage current should be prevented, the electric potential of the electric conductor 3 is automatically controlled to have a negative potential based on an electric potential of the source-drain layer D2 connected to the storage node SN. Therefore, a punch-through between the MOS transistors isolated by the trench isolating structure 20 can be prevented to automatically reduce the generation of a current leakage.

<B-4. Variant>

By utilizing the fact that the trench isolating structure 20 is connected in common including the memory cell MC and the peripheral circuit PC, it is also possible to use the electric conductor 3 as a power supply line, for example, a power supply line for the source-drain layer.

In this case, at least one kind of wiring for power supply is not required. Therefore, a layer for the wiring is not required. Consequently, the semiconductor device can become small-sized by reducing a chip area and decreasing the number of wiring layers.

While the example in which the MOS transistors are isolated by the trench isolating structure 20 has been described in the first and second embodiments according to the present invention, the trench isolating structure according to the present invention is not restricted to the isolation of the MOS transistors but can also be applied to the isolation of the bipolar transistors.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor element formed on a semiconductor substrate and having a source-drain layer; and a trench isolating structure for electrically isolating said semiconductor element adjacently to said source-drain layer, said trench isolating structure including:
    a trench provided in a surface of said semiconductor substrate;
    an electric conductor provided in said trench and having an uppermost portion in a position which is deeper than the deepest portion of said source-drain layer;
    an insulating film provided between a side surface of said electric conductor and said trench; and
    an insulator to fill in said trench on an upper portion of said electric conductor.

2. The semiconductor device according to claim 1, wherein said insulating film also extends between a lower main surface of said electric conductor and said semiconductor substrate.

3. The semiconductor device according to claim 2, further comprising:

a charge storage electrode; and a control system for automatically controlling an electric potential of said electric conductor, said control system comprising:
    a first circuit portion including:
        a first transistor of a first conductivity type having a first electrode connected to a first power source;
        a first resistive element having a first end connected to a second electrode of said first transistor; and
        a second resistive element having a first end connected to a second end of said first resistive element and a second end connected to a second power source for supplying an electric potential having a reverse polarity to said first power source; and
    a second circuit portion including:
        a second transistor of a second conductivity type having a first electrode connected to said second power source;
        a third resistive element having a first end connected to a second electrode of said second transistor; and
        a fourth resistive element having a first end connected to a second end of said third resistive element and a second end grounded, wherein a control electrode of said first transistor is connected to said source drain layer connected to said charge storage electrode, a control electrode of said second transistor is connected to said second end of said first resistive element, and said second end of said third resistive element is connected to said electric conductor.

4. The semiconductor device according to claim 2, wherein a thickness of said insulating film is 10 nm to 20 nm.

5. The semiconductor device according to claim 2, wherein a thickness of said insulator is 100 nm to 1000 nm.

6. The semiconductor device according to claim 2, wherein said insulating film is a silicon oxide film.

7. The semiconductor device according to claim 2, wherein said insulating film is a nitrogen containing oxide film obtained by implanting a nitrogen ion into a silicon oxide film.

8. The semiconductor device according to claim 2, wherein said insulating film is a SiON (silicon oxynitride) film.

9. The semiconductor device according to claim 2, wherein said insulating film is a multilayered film formed by a silicon oxide film provided along an inner surface of said trench and a silicon nitride film provided along said silicon oxide film.

10. The semiconductor device according to claim 2, wherein said electric conductor is a metallic material, and a metal nitride film is further provided along said insulating film between said insulating film and said metallic material.

11. The semiconductor device according to claim 10, wherein said metal nitride film is a TiN film.

12. The semiconductor device according to claim 10, wherein said metal nitride film is a TaN film.

13. The semiconductor device according to claim 2, further comprising a contact portion penetrating said insulator and electrically connected to said electric conductor, wherein said contact portion has a contact hole penetrating said insulator and polysilicon buried in said contact hole, said electric conductor is made of a metallic material, and said trench isolating structure further includes a metal nitride film provided between said metallic material and said polysilicon.

14. The semiconductor device according to claim 13, wherein said metal nitride film is a TiN film.

15. The semiconductor device according to claim 13, wherein said metal nitride film is a TaN film.

* * * * *